(12) United States Patent
Li

(10) Patent No.: US 7,974,097 B2
(45) Date of Patent: Jul. 5, 2011

(54) PRINTED CIRCUIT BOARD AND HEAT SINK

(75) Inventor: Yung-Chou Li, Taoyuan County (TW)

(73) Assignees: Silitek Electronic (Guangzhou) Co., Ltd., Guangzhou (CN); Lite-On Technology Corp., Taipei (TW)

( * ) Notice: Subject to any disclaimer, the term of this patent is extended or adjusted under 35 U.S.C. 154(b) by 127 days.

(21) Appl. No.: 12/485,929

(22) Filed: Jun. 17, 2009

(65) Prior Publication Data

US 2010/0103625 A1 Apr. 29, 2010

(30) Foreign Application Priority Data

Oct. 23, 2008 (CN) .......................... 2008 1 0218662

(51) Int. Cl.
*H05K 7/20* (2006.01)
*F28F 7/00* (2006.01)
*H01L 23/34* (2006.01)

(52) U.S. Cl. ........ 361/712; 361/720; 361/709; 361/710; 361/719; 165/80.1; 165/185; 174/16.3; 174/252; 257/713

(58) Field of Classification Search .................. 361/720, 361/722, 704, 709, 710, 712, 719; 165/80.1–80.3, 165/185; 174/16.3, 252; 257/713
See application file for complete search history.

(56) References Cited

U.S. PATENT DOCUMENTS

| | | | | |
|---|---|---|---|---|
| 4,254,447 | A * | 3/1981 | Griffis | 361/719 |
| 4,344,106 | A * | 8/1982 | West et al. | 361/717 |
| 5,311,395 | A * | 5/1994 | McGaha et al. | 361/720 |
| 5,372,186 | A * | 12/1994 | Taki et al. | 165/80.3 |
| 6,777,105 | B2 * | 8/2004 | Kadokawa | 428/595 |
| 7,599,186 | B2 * | 10/2009 | Gardin | 361/704 |

* cited by examiner

*Primary Examiner* — Zachary M Pape

(57) ABSTRACT

A heat sink for a printed circuit board of power server includes at least one soldering portion. The heat sink is soldered to the printed circuit board at the soldering portion by a lead-free tin soldering process. A plurality of protruding structures protrudes from the soldering portion uniformly. The protruding structures are beneficial for getting a better soldering quality.

6 Claims, 6 Drawing Sheets

PRINTED CIRCUIT BOARD AND HEAT SINK

BACKGROUND OF THE INVENTION

1. Field of the Invention

The invention relates to a printed circuit board and a heat sink and, more particularly, to a printed circuit board supplied with large current and a heat sink capable of dissipating heat and conducting electricity.

2. Description of the Prior Art

When a high-power chip and an electronic component with high heating value, such as field effect transistor (FET), diode, triode, and so on, are disposed on a printed circuit board, heat dissipation and large current conduction for the chip and electronic component during operation are usually achieved by connecting a copper sheet or heat sink. In other words, the copper sheet with high heat dissipation and high electricity conduction can be used to achieve heat dissipation and current conduction. For large current, the copper sheet or heat sink has to be made of copper or brass with large thickness.

In general, the copper sheet or heat sink is soldered on the printed circuit board by soldering tin. Specifically, a soldering portion of the copper sheet or heat sink has to be immersed into a through opening of the printed circuit board. Then, the melted lead-free tin, which is provided by a lead-free tin soldering pot, is drawn upwardly along the soldering portion by capillarity. After solidifying the melted lead-free tin, the copper sheet or heat sink has been fixed in the through opening of the printed circuit board.

At the present time, the soldering process has been gradually changed from lead tin soldering process to lead-free tin soldering process, so as to satisfy restriction of the use of certain hazardous substance in electrical and electronic equipment (RoHS) enacted by European union. Since the lead-free tin has high melting point, the soldering process has to be proceeded in a soldering pot with high temperature so as to melt the lead-free tin, such that the soldering portion of the cooper sheet or heat sink can guide the melted lead-free tin upwardly. However, it is very easy and fast for the copper sheet or heat sink to dissipate heat from the lead-free tin due to high heat dissipation of the copper sheet or heat sink itself. Consequently, the melted lead-free tin will be solidified quickly and the cooper sheet or heat sink with large thickness will be soldered onto the printed circuit board incompletely in lead-free tin soldering process. To solve the aforesaid problems, the prior art usually forms a hole over the soldering portion to reduce heat dissipation of the cooper sheet or heat sink, so as to prevent the lead-free tin from solidifying in a short time. Although heat dissipation still can be maintained, the cooper sheet or heat sink cannot be adapted to large current due to insufficient cross section where the current is passing.

Therefore, it is necessary to provide a heat sink capable of being soldered well and conducting large current and a printed circuit board utilizing the heat sink.

SUMMARY OF THE INVENTION

An objective of the invention is to provide a heat sink comprising a soldering portion. The structure of the soldering portion is designed to reduce heat dissipation and guide lead-free tin upwardly. Accordingly, the heat sink of the invention is capable of being soldered well, dissipating heat, and conducting large current.

Another objective of the invention is to provide a printed circuit board comprising the aforesaid heat sink.

The invention provides a heat sink for a printed circuit board. The heat sink comprises at least one soldering portion. The heat sink is soldered onto the printed circuit board via the soldering portion in a lead-free tin soldering process. A plurality of protruding structures is arranged uniformly and protrudes from the soldering portion.

Preferably, the protruding structure is formed as a strip-shaped tooth, a gap between two adjacent strip-shaped teeth is formed as a rectangular recess, and a width of the rectangular recess is similar to that of the strip-shaped tooth. Preferably, the heat sink is a copper sheet and a length of the strip-shaped tooth is similar to a thickness of the copper sheet. Alternatively, the protruding structure is formed as a triangular tooth, a gap between two adjacent triangular teeth is formed as a reversed triangular recess, and a size of the reversed triangular recess is similar to that of the triangular tooth. Preferably, the heat sink is a copper sheet and a base length of the triangular tooth is similar to a thickness of the copper sheet.

Preferably, the heat sink has an arched shape and at least one couple of chips is connected to the heat sink, such that the couple of chips are electrically connected.

Preferably, at least one electronic component or no electronic component is attached to the heat sink. At least one fixing hole or no fixing hole is formed on the heat sink, the fixing hole is used for accommodating a fixing member, such as a screw or a rivet, and the fixing member is used for fixing the electronic component.

The invention further provides a printed circuit board comprising a plurality of chips and at least one heat sink. The heat sink is soldered onto the printed circuit board in a lead-free tin soldering process and electrically connected to the chips. The heat sink has a soldering portion. A plurality of protruding structures is arranged uniformly and protrudes from the soldering portion. The protruding structures can be formed in a punching manner.

Specifically, the protruding structure is formed as a strip-shaped tooth, a gap between two adjacent strip-shaped teeth is formed as a rectangular recess, and a width of the rectangular recess is similar to that of the strip-shaped tooth. Preferably, the heat sink is a copper sheet and a length of the strip-shaped tooth is similar to a thickness of the copper sheet. Alternatively, the protruding structure is formed as a triangular tooth, a gap between two adjacent triangular teeth is formed as a reversed triangular recess, and a size of the reversed triangular recess is similar to that of the triangular tooth. Preferably, the heat sink is a copper sheet and a base length of the triangular tooth is similar to a thickness of the copper sheet.

Preferably, the printed circuit board further comprises at least one electronic component or no electronic component. The electronic component has a plurality of pins. The electronic component is connected to the printed circuit board by the pins and is electrically connected to the heat sink. One side surface of the electronic component is attached to a surface of the heat sink. Preferably, at least one fixing hole or no fixing hole is formed on the heat sink, the fixing hole is used for accommodating a fixing member, such as a screw or a rivet, and the fixing member is used for fixing the electronic component.

Compared to the prior art, the invention provides a printed circuit board for a server with large power. The printed circuit board utilizes a copper sheet to dissipate heat and conduct large current. A plurality of protruding structures is formed on a soldering portion of the copper sheet. Since the protruding structures are arranged uniformly, melted lead-free tin can be drawn to the surface of the printed circuit board successfully before being solidified, so as to achieve perfect soldering quality without forming a hole over the soldering portion of the heat sink. Therefore, a sufficient area is retained for conducting current. Accordingly, the heat sink can be served as a conductive frame for conducting large current.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
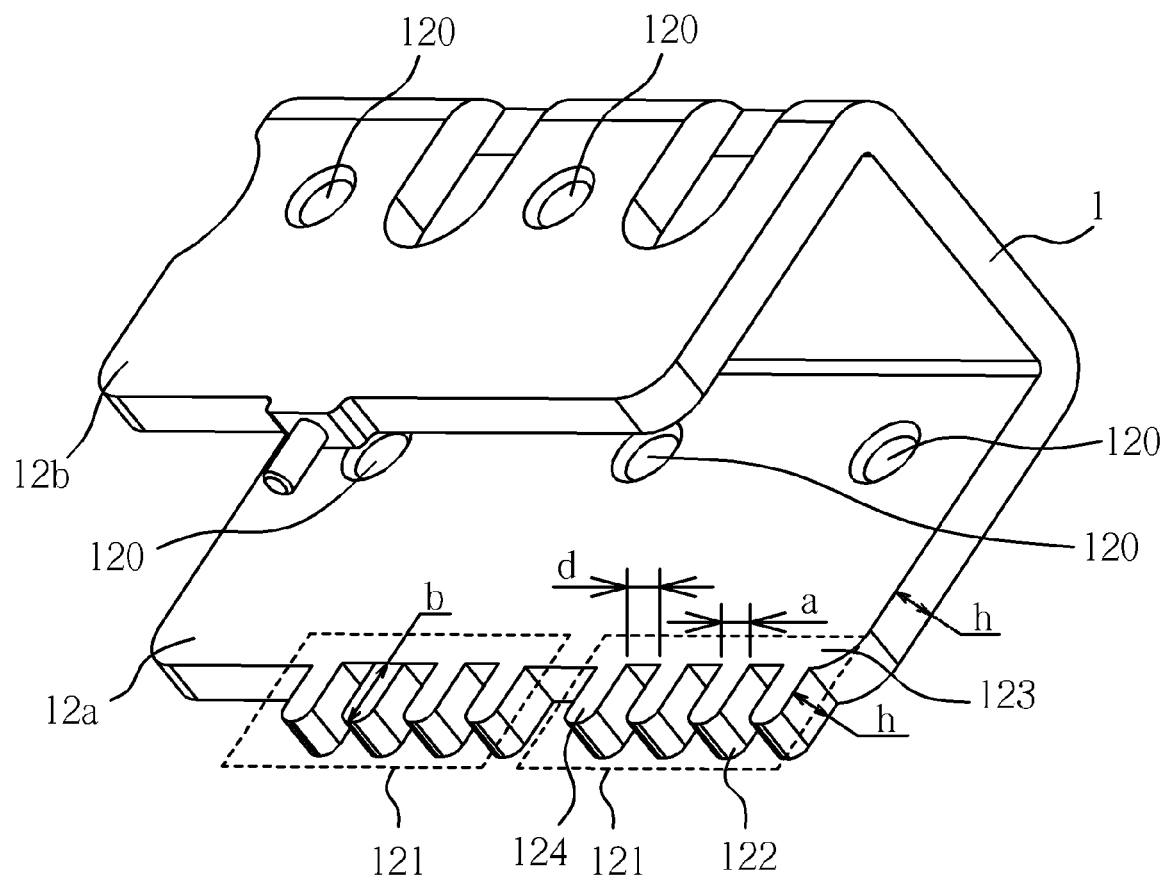
FIG. 1 is a perspective view illustrating a heat sink according to a first embodiment of the invention.

Referring to FIG. 1, the invention provides a heat sink 1 for a printed circuit board. The heat sink 1 is manufactured by bending a copper sheet to form an arched shape. The arched heat sink 1 has a back portion and a couple of side arms 12a, 12b protruding from the back portion vertically. A plurality of fixing holes 120 is formed on the side arms 12a, 12b and used for fixing electronic component (not shown), which will generate heat during operation. One end of the side arm 12a has two soldering portions 121. In the soldering portion, a protruding structure 122 protrudes from a sheet-shaped body 123 for improving soldering quality.

Figure 2:
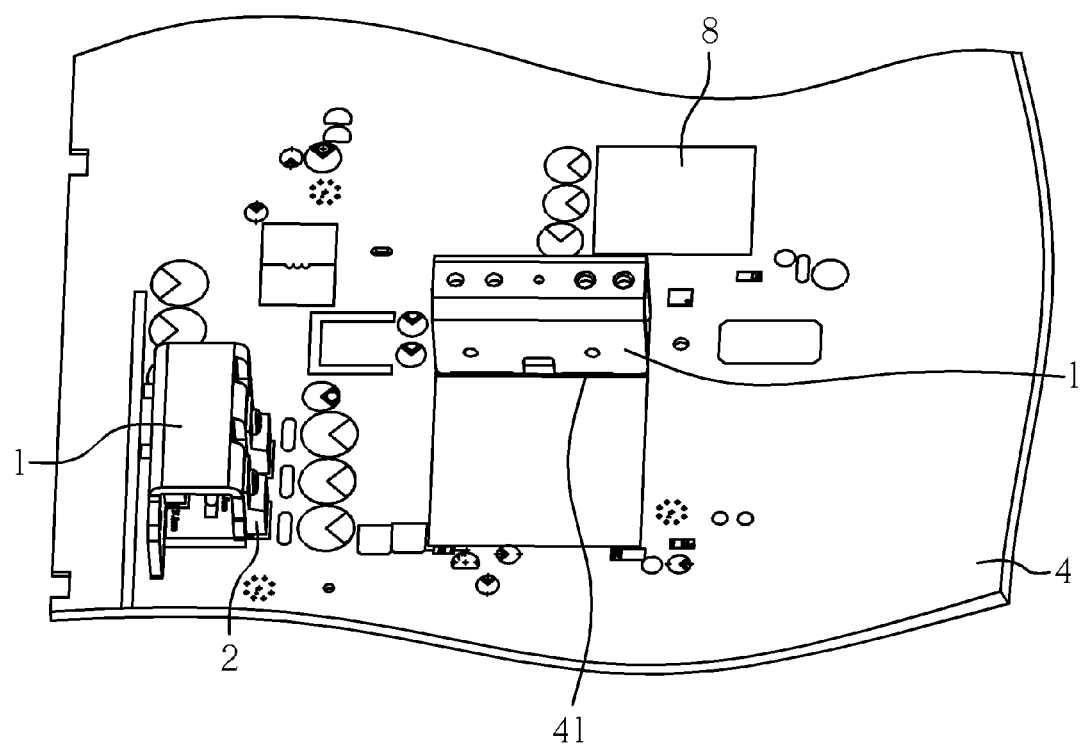
FIG. 2 is a schematic diagram illustrating a printed circuit board equipped with two heat sinks according to the invention.

Referring to FIG. 2, to dispose the heat sink 1 shown in FIG. 1 on a printed circuit board 4, a plurality of through openings 41 is formed on the printed circuit board 4. After heating the printed circuit board 4 shown in FIG. 2 in a soldering pot, lead-free tin is kept at a melted state. When the soldering portion 121 of the heat sink 1 is immersed into the through opening 41, the melted lead-free tin is drawn upwardly along a lateral contact surface 124 of the protruding structure 122 and the sheet-shaped body 123 in a lateral direction by capillarity.

To improve soldering quality, a length or width of the protruding structure 122 of the soldering portion 121 is smaller than that of the sheet-shaped body 123. That is to say, the protruding structure 122 has a small contact area so as to prevent the melted lead-free tin from solidifying too fast due to heat dissipation of the soldering portion 121. In this way, the protruding structure 122 still can guide the melted lead-free tin upwardly to improve soldering quality. For example, as shown in FIG. 1, a gap is between two adjacent protruding structures 122 of the soldering portion 121, such that heat dissipation of the soldering portion 121 is reduced to prevent the melted lead-free tin from solidifying too fast. Furthermore, the protruding structure 122 can be used to guide the melted lead-free tin upwardly. Therefore, when the soldering portion 121 is immersed into the through opening 41, the lead-free tin can be kept at a melted state and the soldering portion 121 can guide the melted lead-free tin upwardly and successfully along the lateral contact surface 124 of the protruding structure 122 and the sheet-shaped body 123 in a lateral direction, so as to improve soldering quality. In the soldering portion 121, the gaps among the protruding structures 122 will be filled with solidified lead-free tin. Accordingly, the heat dissipation and electricity conduction of the heat sink 1 will not be affected.

Preferably, the protruding structure 122 can be formed as a strip-shaped tooth. Each strip-shaped tooth has an identical width a, an identical length b, and an identical thickness h. In this embodiment, the protruding structure 122 can be formed in a punching manner. In other words, the protruding structure 122 can be formed by punching an edge of a copper sheet directly, so that the thickness h of the protruding structure 122 is substantially the same as the thickness h of the copper sheet. Moreover, to achieve good soldering quality, the width a of the strip-shaped tooth can be substantially the same as the thickness h. The strip-shaped tooth substantially has a rectangular shape. A tail end of the strip-shaped tooth can be flat or, preferably, be arc as shown in FIG. 1, so as to reduce acute angle, avoid damage, or increase aesthetic feeling. A gap is between two adjacent teeth and the gap is formed as a rectangular recess. The rectangular recess has a width d similar to the width a of the strip-shaped tooth. That is to say, the strip-shaped teeth have an identical size and are arranged uniformly so as to achieve better soldering quality.

Figure 3:
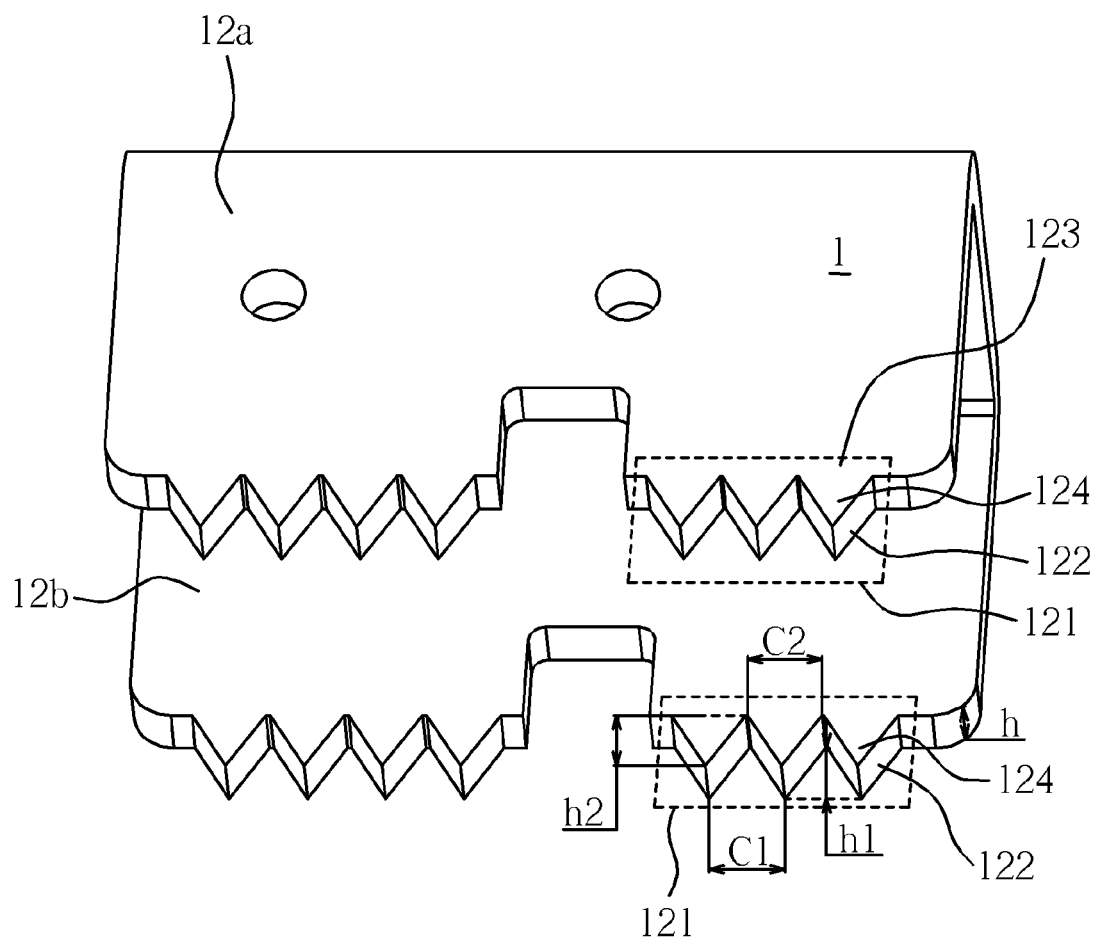
FIG. 3 is a perspective view illustrating a heat sink according to a second embodiment of the invention.

As shown in FIG. 3, alternatively, the protruding structure 122 can be formed as a triangular tooth and a gap between two adjacent triangular teeth is formed as a reversed triangular recess, such that the soldering portion 121 has a saw-toothed shape. The saw-toothed protruding structure can also obtain good soldering quality. Preferably, the triangular tooth is formed as a regular triangle and a size of the reversed triangular recess is similar to that of the triangular tooth. Specifically, a base length c1 of the reversed triangular recess is similar to a base length c2 of the triangular tooth and a height h1 of the reversed triangular recess is similar to a height h2 of the triangular tooth. In other words, the triangular teeth have an identical size and are arranged uniformly so as to achieve good soldering quality. Furthermore, to achieve better soldering quality, the heights h1 and h2 can be substantially the same as the thickness h of the copper sheet.

Figure 4:
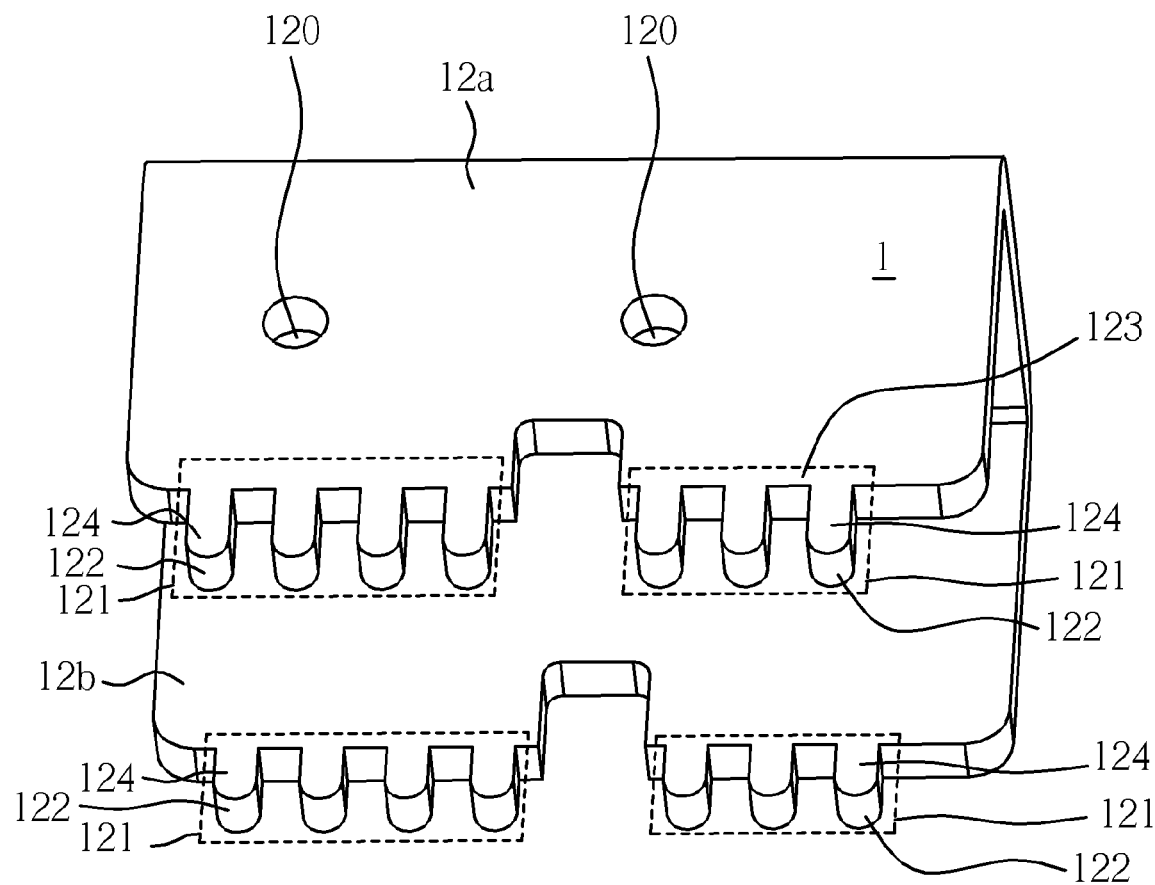
FIG. 4 is a perspective view illustrating a heat sink according to a third embodiment of the invention.

Based on the design of the printed circuit board, the heat sink 1 can comprise a plurality of soldering portions 121 corresponding to the printed circuit board. As shown in FIG. 3, there are soldering portions 121 formed on the tail ends of the side arms 12a, 12b of the heat sink 1 and a plurality of protruding structures 122 protrudes from each soldering portion 121. The feature of the protruding structure 122 shown in FIG. 4 is substantially the same as that of the protruding structure 122 shown in FIG. 1 or, alternatively, that of the protruding structure 122 shown in FIG. 2. It should be noted that, except the protruding structure 122 shown in FIG. 1 or 2, the protruding structure 122 can be further designed as other forms as long as the protruding structures 122 have an identical size and are arranged uniformly.

Figure 5:
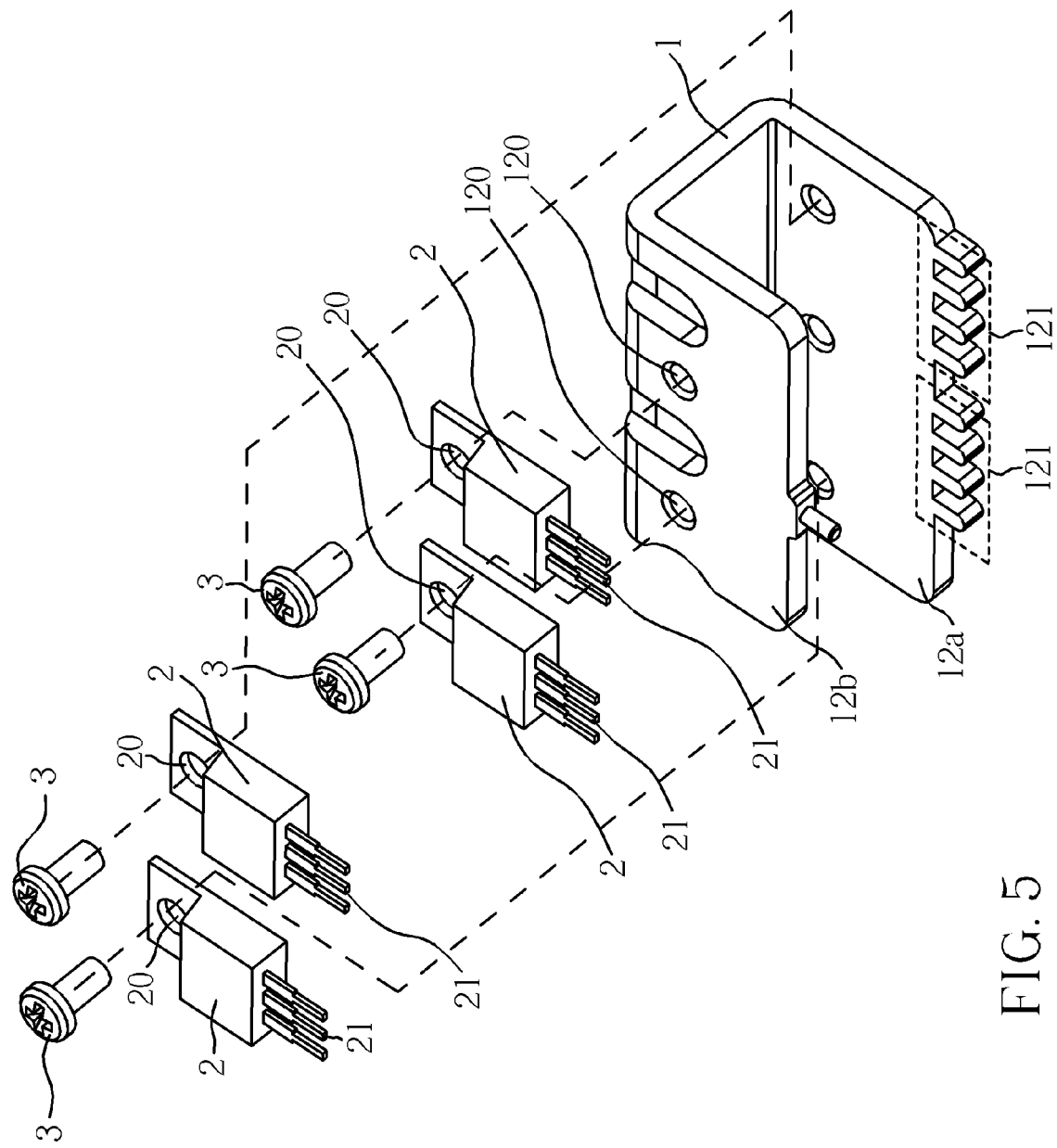
FIG. 5 is an exploded view illustrating the heat sink and electronic components according to the invention.

Referring to FIG. 5, the side arms 12a, 12b of the heat sink 1 have a plurality of fixing holes 120 formed thereon for accommodating fixing members 3, and the fixing members 3 are used for fixing the electronic components 2. The fixing members 3 can be screws shown in FIG. 4, rivets, or the like. In general, the electronic component can be field effect transistor, triode, diode, or the like. The electronic component 2 has a plurality of pins 21. The electronic component 2 can be connected to the printed circuit board by the pins 21. The electronic component 2 also has fixing hole 20 formed thereon. The fixing member 3 can pass through the fixing holes 20 and 120 to fix the electronic component 2 and the heat sink 1, such that the electronic component 2, which generates heat, is attached to the side arms 12a or 12b of the heat sink 1. Accordingly, the heat generated by the electronic component 2 can be dissipated via the heat sink. It should be noted that the electronic component 2 can be fixed by soldering or other manners except the aforesaid screw or rivet.

Furthermore, the heat sink 1 is not limited to arched shape. In general, for connecting chip and conducting large current, the heat sink is usually designed as a simple arched structure.

Figure 6:
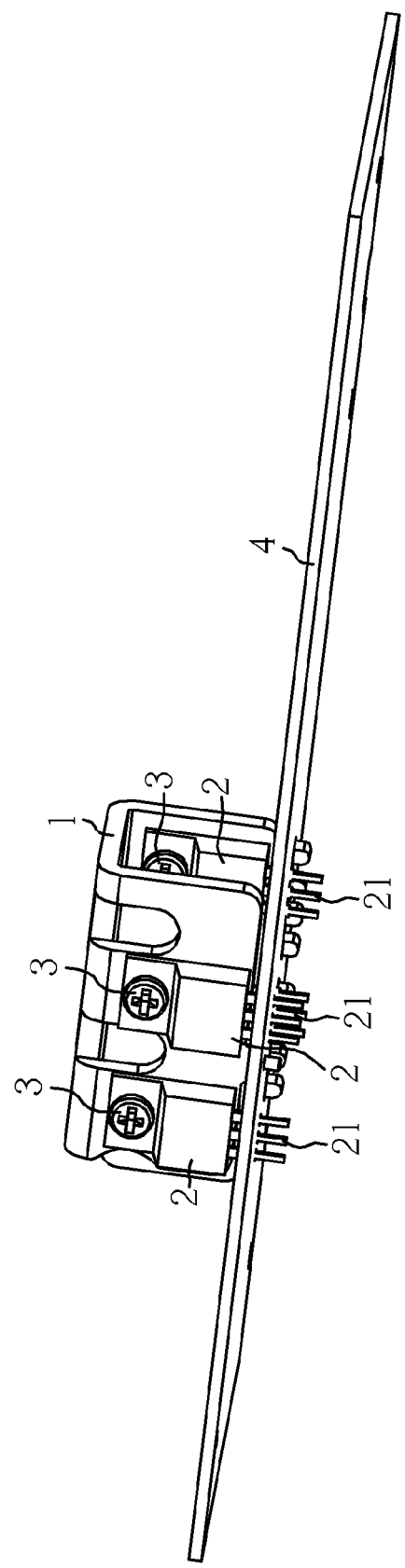
FIG. 6 is an assembly diagram illustrating the heat sink, which is equipped with four electronic components, shown in FIG. 5 being installed on the printed circuit board.

Referring to FIG. 6, the aforesaid heat sink 1 is connected to the printed circuit board 4. The printed circuit board 4 of the invention for a server with large power comprises a plurality of chips 8 (shown in FIG. 2) and at least one heat sink 1. The heat sink 1 is soldered on the printed circuit board 4 in a lead-free tin soldering process. The soldering portion 121 of the heat sink 1 is immersed into the printed circuit board 4 and sealed by lead-free tin, such that the protruding structures 122 of the soldering portion 121 of the heat sink 1 are indistinctly seen on the back of the printed circuit board 4. The heat sink 1 is electrically connected to the chips 8 after being immersed into the printed circuit board 4. It should be noted that the heat sink 1 is thicker than a copper foil in common printed circuit board, so the cross section is large enough for conducting large current. Moreover, there is no hole structure, which is beneficial for soldering, formed on the side arms 12a, 12b of the heat sink 1 and over the soldering portion 121, so the electricity conducting area is still large enough for conducting large current.

In general, the printed circuit board 4 can further comprise at least one electronic component 2, such as field effect transistor, diode, triode, and so on. The electronic component 2 has a plurality of pins 21. The electronic component 2 can be connected to the printed circuit board 4 by the pins 21 and be electrically connected to the heat sink 1. One side surface of the electronic component 2 is attached to a surface of the heat sink 1. The electronic component 2 can be fixed to the heat sink 1 by inserting a fixing member, such as a screw or a rivet, into the fixing hole 120 of the heat sink 1 (as shown in FIG. 4) and the fixing hole 20 of the electronic component 2. As shown in FIG. 5, there is a heat sink 1 on the printed circuit board 4 and there are four electronic components 2 attached on the heat sink 1. The heat generated by the electronic components 2 can be quickly dissipated by the heat sink 1.

It should be noted that there can also be no electronic component 2 attached on the heat sink 1. As shown in FIG. 2, there are two heat sinks 1 on the printed circuit board 4 and one of the heat sinks 1 is mainly used for connecting the chip 8 and conducting large current.

Those skilled in the art will readily observe that numerous modifications and alterations of the device and method may be made while retaining the teachings of the invention.

What is claimed is:

1. A heat sink for a printed circuit board, the printed circuit board comprising a through opening for accommodating melted lead-free tin, the heat sink comprising at least one soldering portion, the soldering portion being immersed into the through opening for guiding the melted lead-free tin upwardly along a surface of the soldering portion, the heat sink being characterized in that the soldering portion comprises a sheet-shaped body and a protruding structure protruding from the sheet-shaped body, wherein a contact area of the protruding structure for the melted lead-free tin is smaller than that of the sheet-shaped body so as to reduce heat conduction effect between the soldering portion and the melted lead-free tin, the protruding structure being capable of guiding the melted lead-free tin upwardly along a lateral contact surface of the protruding structure and the sheet-shaped body in a lateral direction;

wherein the protruding structure is formed as a triangular tooth, a gap between two adjacent triangular teeth is formed as a reversed triangular recess, and a size of the reversed triangular recess is similar to that of the triangular tooth.

2. The heat sink of claim 1, wherein the protruding structure is formed in a punching manner.

3. The heat sink of claim 1, wherein the heat sink has an arched shape, at least one couple of chips or no chip is connected to the heat sink, such that the couple of chips are electrically connected or both ends of the printed circuit board are electrically connected.

4. The heat sink of claim 3, wherein at least one electronic component or no electronic component is attached to the heat sink.

5. The heat sink of claim 4, wherein at least one fixing hole or no fixing hole is formed on the heat sink, the fixing hole is used for accommodating a fixing member, and the fixing member is used for fixing the electronic component.

6. The heat sink of claim 5, wherein the fixing member is a screw or a rivet.

* * * * *